(12) United States Patent
Kingsley et al.

(10) Patent No.: US 10,270,384 B2
(45) Date of Patent: Apr. 23, 2019

(54) SYSTEMS AND METHODS FOR DUAL TILT, BALLASTED PHOTOVOLTAIC MODULE RACKING

(71) Applicant: Alion Energy, Inc., Richmond, CA (US)

(72) Inventors: Mark Kingsley, Hollis, NH (US); Jesse Atkinson, San Francisco, CA (US); Sean Bailey, Emeryville, CA (US); Karl Johnson, Berkeley, CA (US); Brett West, Martinez, CA (US); Luis Francisco Castro Hernandez, Richmond, CA (US)

(73) Assignee: Alion Energy, Inc., Richmond, CA (US)

( * ) Notice: Subject to any disclaimer, the term of this patent is extended or adjusted under 35 U.S.C. 154(b) by 0 days.

(21) Appl. No.: 15/728,416

(22) Filed: Oct. 9, 2017

(65) Prior Publication Data

US 2018/0159464 A1     Jun. 7, 2018

Related U.S. Application Data

(60) Provisional application No. 62/406,874, filed on Oct. 11, 2016, provisional application No. 62/406,322, filed on Oct. 10, 2016.

(51) Int. Cl.
*H01L 31/044* (2014.01)
*H02S 30/10* (2014.01)
(Continued)

(52) U.S. Cl.
CPC .............. *H02S 30/10* (2014.12); *H02S 20/10* (2014.12); *H02S 20/24* (2014.12); *H02S 30/20* (2014.12); *H02S 40/10* (2014.12); *H01L 31/00* (2013.01)

(58) Field of Classification Search
CPC ......... Y02E 10/50–10/60; H02S 20/00–20/32; H02S 40/00–40/44
(Continued)

(56) References Cited

U.S. PATENT DOCUMENTS 6,672,018 B2     1/2004 Shingleton
8,826,608 B2     9/2014 Vaidyanathan
(Continued)

FOREIGN PATENT DOCUMENTS

EP     2746698 A2     6/2014

OTHER PUBLICATIONS

Patent Cooperation Treaty International Search Report for International Application No. PCT/US2017/055754, dated Jan. 5, 2018 (3 pages).

(Continued)

*Primary Examiner* — Bach T Dinh
(74) *Attorney, Agent, or Firm* — Jones Day

(57) ABSTRACT

Systems and methods for dual tilt, ballasted photovoltaic module racking are provided herein. Under one aspect, a system for supporting first and second photovoltaic modules can include first and second elongated stiffeners respectively configured to be coupled to and support the first and second photovoltaic modules. The system also can include first and second feet respectively configured to be coupled to first and second grooves respectively provided within first and second ballasts. The system also can include a first stiffener hinge rotatably coupling the first and second stiffeners to one another, a first foot hinge rotatably coupling the first foot to the first stiffener, and a second foot hinge rotatably coupling the second foot to the second stiffener. At least one of the first stiffener hinge and the first and second foot hinges can include a respective mechanical stop inhibiting rotation of that hinge beyond a respective predetermined angle.

20 Claims, 12 Drawing Sheets

(51) Int. Cl.
    *H02S 40/10*     (2014.01)
    *H02S 30/20*     (2014.01)
    *H02S 20/10*     (2014.01)
    *H02S 20/24*     (2014.01)
    *H01L 31/00*     (2006.01)

(58) Field of Classification Search
    USPC .................................................. 136/243–265
    See application file for complete search history.

(56) References Cited

U.S. PATENT DOCUMENTS

| | | |
|---|---|---|
| 2006/0266352 A1 | 11/2006 | Marston et al. |
| 2010/0269429 A1* | 10/2010 | Belikoff .................. H02S 20/23 |
| | | 52/173.3 |
| 2010/0294340 A1* | 11/2010 | Cunningham .......... H02S 20/00 |
| | | 136/251 |
| 2012/0132260 A1* | 5/2012 | Hirsch .................... H02S 20/24 |
| | | 136/251 |
| 2013/0112248 A1 | 5/2013 | McPheeters |
| 2013/0305518 A1* | 11/2013 | Adriani .................. H01L 31/18 |
| | | 29/592.1 |
| 2015/0179848 A1* | 6/2015 | Korman .................. H02S 30/20 |
| | | 136/245 |
| 2016/0056752 A1 | 2/2016 | Atchley et al. |

OTHER PUBLICATIONS

Patent Cooperation Treaty Written Opinion of the International Searching Authority for International Application No. PCT/US2017/055754, dated Jan. 5, 2018 (7 pages).

\* cited by examiner

 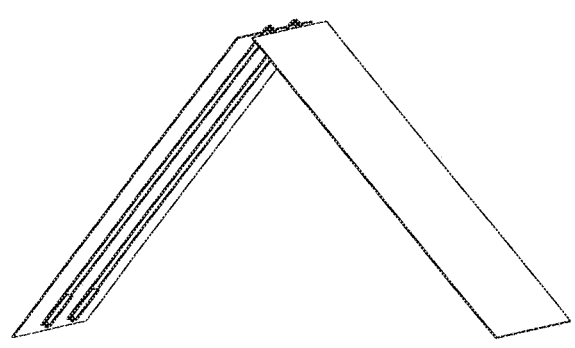
Fig. 15A	Fig. 15B
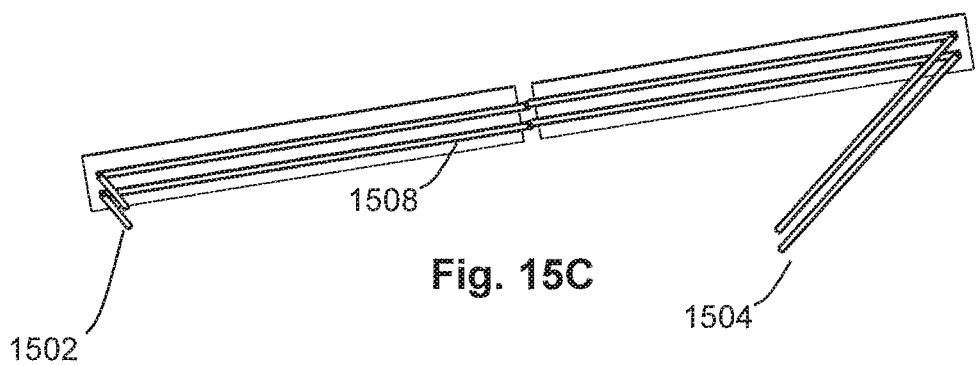
Fig. 15C
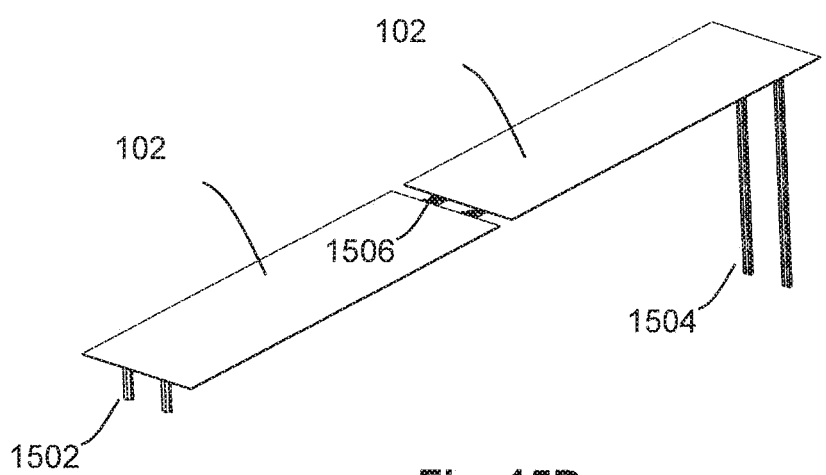
Fig. 15D

SYSTEMS AND METHODS FOR DUAL TILT, BALLASTED PHOTOVOLTAIC MODULE RACKING

CROSS-REFERENCE TO RELATED APPLICATIONS

This application claims the benefit of the following applications, the entire contents of each of which are incorporated by reference herein:

U.S. Provisional Application No. 62/406,322, filed Oct. 10, 2016 and entitled "Systems and Methods for Dual Tilt Ballasted Photovoltaic Racking System," and U.S. Provisional Application No. 62/406,874, filed Oct. 11, 2016 and entitled "Systems and Methods for Single and Dual Tilt Ballasted Photovoltaic Racking System."

FIELD

This invention pertains to solar photovoltaic power plants.

BACKGROUND

A key component of a solar photovoltaic (PV) power plant is a mechanical support structure, which can be referred to as racking, that holds the PV modules of the power plant. Large numbers of mechanical support structures can be used for large solar plants.

SUMMARY

Systems and methods for dual tilt, ballasted photovoltaic module racking are provided herein.

Under one aspect, a system is provided for supporting first and second photovoltaic modules. The system can include first and second elongated stiffeners respectively configured to be coupled to and support the first and second photovoltaic modules. The system also can include first and second feet respectively configured to be coupled to first and second grooves respectively provided within first and second ballasts. The system also can include a first stiffener hinge rotatably coupling the first and second stiffeners to one another, a first foot hinge rotatably coupling the first foot to the first stiffener, and a second foot hinge rotatably coupling the second foot to the second stiffener. At least one of the first stiffener hinge and the first and second foot hinges can include a respective mechanical stop inhibiting rotation of that hinge beyond a respective predetermined angle.

In some configurations, the first and second foot hinges optionally each includes a respective mechanical stop inhibiting rotation of that hinge beyond the respective predetermined angle. In some configurations, the first and second ballasts optionally each includes an elongated piece of concrete having at least two grooves provided therein. In some configurations, the first stiffener optionally is configured to be coupled along an edge of the first photovoltaic module, and the second stiffener optionally is configured to be coupled along an edge of the second photovoltaic module.

In some configurations, the system optionally further can include third and fourth elongated stiffeners respectively configured to be coupled to and support the first and second photovoltaic modules, and third and fourth feet respectively configured to be coupled to the first and second grooves. The system optionally further can include a second stiffener hinge rotatably coupling the third and fourth stiffeners to one another, a third foot hinge rotatably coupling the third foot to the third stiffener, and a fourth foot hinge rotatably coupling the fourth foot to the fourth stiffener. Optionally, the first and third stiffeners are parallel to one another and configured to be coupled to an underside of the first photovoltaic module; and optionally the second and fourth stiffeners are parallel to one another and configured to be coupled to an underside of the second photovoltaic module.

In some configurations, the first stiffener optionally further is configured to be coupled to and support a third photovoltaic module; and the second stiffener optionally further is configured to be coupled to and support a fourth photovoltaic module.

In some configurations, when the first and second feet respectively are coupled to the first and second grooves, the first and second stiffeners optionally are at an angle of approximately 180 degrees to one another. As a further option, the first and second feet can be different lengths than one another. In some configurations, when the first and second feet respectively are coupled to the first and second grooves, the first and second stiffeners optionally are at an angle of approximately 120-160 degrees to one another. Additionally, or alternatively, the first and second feet can be the same lengths as one another.

Under another aspect, a method is provided for supporting first and second photovoltaic modules. The method can include providing first and second elongated stiffeners respectively configured to be coupled to the first and second photovoltaic modules so as respectively to support the first and second photovoltaic modules. The method also can include respectively coupling first and second feet to first and second grooves respectively provided within first and second ballasts. The first and second stiffeners can be rotatably coupled to one another with a first stiffener hinge, the first foot and the first stiffener can be rotatably coupled to one another with a first foot hinge, and the second foot and the second stiffener can be rotatably coupled to one another with a second foot hinge. At least one of the first stiffener hinge and the first and second foot hinges can include a respective mechanical stop inhibiting rotation of that hinge beyond a respective predetermined angle.

In some configurations, the first and second foot hinges optionally each includes a respective mechanical stop inhibiting rotation of that hinge beyond the respective predetermined angle. In some configurations, the first and second ballasts optionally each includes an elongated piece of concrete having at least two grooves provided therein. In some configurations, the first stiffener is configured to be coupled along an edge of the first photovoltaic module, and the second stiffener is configured to be coupled along an edge of the second photovoltaic module.

In some configurations, third and fourth elongated stiffeners optionally are configured to be coupled to the first and second photovoltaic modules so as respectively to support the first and second photovoltaic modules. The method further optionally can include respectively coupling third and fourth feet to the first and second grooves. The third and fourth stiffeners can be rotatably coupled to one another with a second stiffener hinge, the third foot can be rotatably coupled to the third stiffener with a third foot hinge, and the fourth foot can be rotatably coupled to the fourth stiffener with a fourth foot hinge. In some configurations, the first and third stiffeners optionally are parallel to one another and configured to be coupled to an underside of the first photovoltaic module, the second and fourth stiffeners optionally are parallel to one another and configured to be coupled to an underside of the second photovoltaic module.

In some configurations, the first stiffener further optionally is configured to be coupled to a third photovoltaic module so as to support the third photovoltaic module; and the second stiffener further optionally is configured to be coupled to a fourth photovoltaic module so as to support the fourth photovoltaic module.

In some configurations, when the first and second feet respectively are coupled to the first and second grooves, the first and second stiffeners optionally are at an angle of approximately 180 degrees to one another. As a further option, the first and second feet can be different lengths than one another. In some configurations, when the first and second feet respectively are coupled to the first and second grooves, the first and second stiffeners optionally are at an angle of approximately 120-160 degrees to one another. Additionally, or alternatively, the first and second feet can be the same lengths as one another.

In some configurations, the method optionally further can include receiving a crate storing the first and second feet folded parallel to the first and second photovoltaic modules by respective rotation of the first and second foot hinges and the first and second stiffeners folded parallel to one another by rotation of the first stiffener hinge. The method optionally further can include removing the first and second photovoltaic modules coupled to the folded first and second stiffeners coupled to the folded first and second feet from the received crate. The method optionally further can include respectively unfolding the first and second feet by rotating the first and second foot hinges, unfolding the first and second stiffeners by rotating the first stiffener hinge, inserting the unfolded first foot into the first groove, and inserting the unfolded second foot into the second groove. The method optionally further can include adhering the first foot into the first groove, and adhering the second foot into the second groove.

Under still another aspect, an assembly is provided for supporting photovoltaic modules. The assembly can include first, second, and third elongated ballasts, each including first and second grooves and being arranged substantially parallel to one another. A first system of the assembly can include first and second elongated stiffeners respectively coupled to and supporting first and second photovoltaic modules and first and second feet respectively coupled to the first groove of the first ballast and the first groove of the second ballast, as well as a first stiffener hinge rotatably coupling the first and second stiffeners to one another, a first foot hinge rotatably coupling the first foot to the first stiffener, and a second foot hinge rotatably coupling the second foot to the second stiffener. A second system of the assembly can include third and fourth elongated stiffeners respectively coupled to and supporting third and fourth photovoltaic modules and third and fourth feet respectively coupled to the second groove of the second ballast and the first groove of the third ballast, as well as a second stiffener hinge rotatably coupling the third and fourth stiffeners to one another, a third foot hinge rotatably coupling the third foot to the third stiffener, and a fourth foot hinge rotatably coupling the fourth foot to the fourth stiffener.

Optionally, the assembly further can include a vehicle configured to drive along the first and second ballasts. The vehicle can include first and second wheels contacting the first ballast, third and fourth wheels contacting the second ballast, and a body coupled to the first, second, third, and fourth wheels. In some configurations, the third and fourth wheels optionally contact the second ballast within a gap between the second photovoltaic module and the third photovoltaic module. In some configurations, the body optionally is configured to pass over the first and second photovoltaic modules as the vehicle drives along the first and second ballasts. In some configurations, the body optionally is configured to pass under the first and second photovoltaic modules as the vehicle drives along the first and second ballasts. In some configurations, the first and second ballasts optionally each further includes a third groove disposed between the first and second grooves. The first and second wheels optionally can contact the third groove of the first ballast, the third and fourth wheels optionally can contact the fourth groove of the second ballast.

In some configurations, at least one of the first stiffener hinge and the first and second foot hinges optionally includes a respective mechanical stop inhibiting rotation of that hinge beyond a respective predetermined angle; and at least one of the second stiffener hinge and the third and fourth foot hinges optionally includes a respective mechanical stop inhibiting rotation of that hinge beyond a respective predetermined angle. In some configurations, the first stiffener optionally is configured to be coupled along an edge of the first photovoltaic module, and wherein the second stiffener is configured to be coupled along an edge of the second photovoltaic module. In some configurations, the first stiffener further is configured to be coupled to and support a fifth photovoltaic module, and the second stiffener further is configured to be coupled to and support a sixth photovoltaic module.

Under yet another aspect, a method is provided for supporting photovoltaic modules. The method can include providing first, second, and third elongated ballasts, each including first and second grooves and being arranged substantially parallel to one another. The method can include providing a first system, the providing of which can include providing first and second elongated stiffeners respectively configured to be coupled to first and second photovoltaic modules so as respectively to support the first and second photovoltaic modules; and respectively coupling first and second feet to the first groove of the first ballast and the first groove of the second ballast. The first and second stiffeners can be rotatably coupled to one another with a first stiffener hinge, the first foot and the first stiffener can be rotatably coupled to one another with a first foot hinge, and the second foot and the second stiffener can be rotatably coupled to one another with a second foot hinge. The method also can include providing a second system, the providing of which can include providing third and fourth elongated stiffeners configured to be coupled to third and fourth photovoltaic modules so as respectively to support the third and fourth photovoltaic modules, and respectively coupling third and fourth feet to the second groove of the second ballast and the first groove of the third ballast. The third and fourth stiffeners can be rotatably coupled to one another with a second stiffener hinge, the third foot and the third stiffener can be rotatably coupled to one another with a third foot hinge, and the fourth foot and the fourth stiffener can be rotatably coupled to one another with a fourth foot hinge.

In some configurations, the method optionally further can include providing a vehicle configured to drive along the first and second ballasts. The vehicle can include first and second wheels contacting the first ballast, third and fourth wheels contacting the second ballast, and a body coupled to the first, second, third, and fourth wheels. In some configurations, the third and fourth wheels optionally contact the second ballast within a gap between the second photovoltaic module and the third photovoltaic module. In some configurations, the body optionally passes over the first and second photovoltaic modules as the vehicle drives along the first and second ballasts. In some configurations, the body optionally passes under the first and second photovoltaic modules as the vehicle drives along the first and second ballasts. In some configurations, the first and second ballasts optionally each further includes a third groove disposed between the first and second grooves. In some configurations, the first and second wheels optionally contact the third groove of the first ballast, and the third and fourth wheels optionally contact the fourth groove of the second ballast.

In some configurations, at least one of the first stiffener hinge and the first and second foot hinges optionally includes a respective mechanical stop inhibiting rotation of that hinge beyond a respective predetermined angle, and at least one of the second stiffener hinge and the third and fourth foot hinges optionally includes a respective mechanical stop inhibiting rotation of that hinge beyond a respective predetermined angle. In some configurations, the first stiffener optionally is configured to be coupled along an edge of the first photovoltaic module, and the second stiffener optionally is configured to be coupled along an edge of the second photovoltaic module. In some configurations, the first stiffener further optionally is configured to be coupled to a fifth photovoltaic module so as to support the fifth photovoltaic module, and the second stiffener further optionally is configured to be coupled to a sixth photovoltaic module so as to support the sixth photovoltaic module.

In some configurations, the method further optionally can include receiving a crate storing the first system in a shipping configuration, which can include the first and second feet folded parallel to the first and second photovoltaic modules by respective rotation of the first and second foot hinges, and the first and second stiffeners folded parallel to one another by rotation of the first stiffener hinge. The crate further optionally can store the second system in a shipping configuration, which can include the third and fourth feet folded parallel to the third and fourth photovoltaic modules by respective rotation of the third and fourth foot hinges, and the third and fourth stiffeners folded parallel to one another by rotation of the second stiffener hinge. The method optionally can include removing the folded first system from the shipped crate, removing the folded second system from the shipped crate, and unfolding the first system into an installation configuration, which can include respectively unfolding the first and second feet by rotating the first and second foot hinges, and unfolding the first and second stiffeners by rotating the first stiffener hinge. The method optionally also can include unfolding the second system into an installation configuration, which can include respectively unfolding the third and fourth feet by rotating the third and fourth foot hinges, and unfolding the third and fourth stiffeners by rotating the second stiffener hinge. The method also can include inserting the unfolded first foot into the first groove of the first ballast, inserting the unfolded second foot into the first groove of the second ballast, inserting the unfolded third foot into the second groove of the second ballast, and inserting the unfolded fourth foot into the first groove of the third ballast. Optionally, the method further can include adhering the first foot into the first groove of the first ballast, adhering the second foot into the first groove of the second ballast, adhering the third foot into the second groove of the second ballast, and adhering the fourth foot into the first groove of the third ballast.

BRIEF DESCRIPTION OF DRAWINGS

FIGS. 15A-15D schematically illustrate an alternative ballasted racking system, according to certain configurations.

DETAILED DESCRIPTION

Systems and methods for dual tilt, ballasted photovoltaic module racking are provided herein. According to various embodiments provided herein, photovoltaic (PV) power plants that include solar panels at two or more orientations or tilts can have advantages over a PV power plan that includes solar panels at only a single orientation or tilt. Orientation can refer to the slope and/or direction of a PV panel relative to a fixed vector, such as a horizontal arrow pointing north. A dual-orientation system can include solar modules at two orientations. In one non-limiting example, the orientations can be a 15 degree slope facing east and a 15 degree slope facing west, but the modules may face any direction and may have any suitable angle or slope. A dual-orientation system can also be referred to as a dual-tilt system.

Certain embodiments of a dual-tilt system, as compared to a single-tilt system, may produce more power per unit land area, experience lower wind loads, better handle loads that exist, and have a broader curve of power production. For example, an embodiment of a dual-tilt system with modules facing east and west may produce more power in the mornings and/or afternoons than can a single-tilt system. Embodiments of a dual-tilt system may produce more power per unit area of land or surface space. A dual tilt system may have more panel density on a site than a single tilt system. For example, the panels may be placed closer together without shading.

Figure 1A:
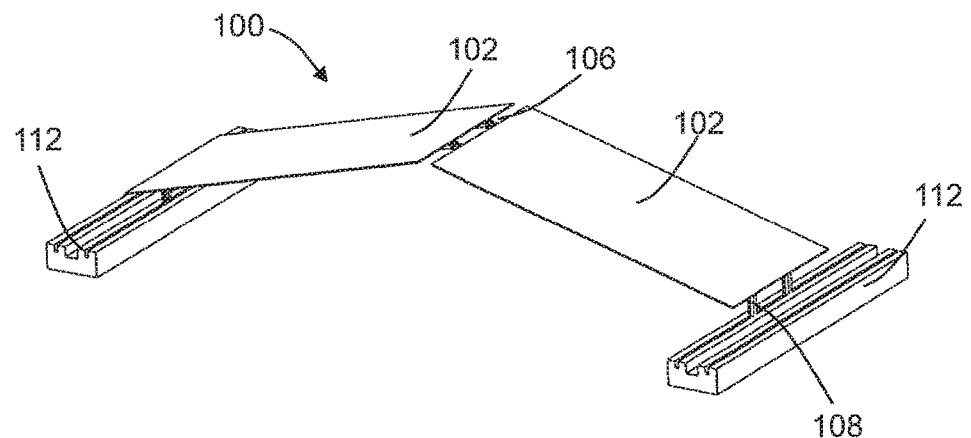
FIGS. 1A and 1B schematically illustrate perspective views of an individual dual tilt, ballasted racking system holding photovoltaic panels, according to certain configurations.
Figure 1B:
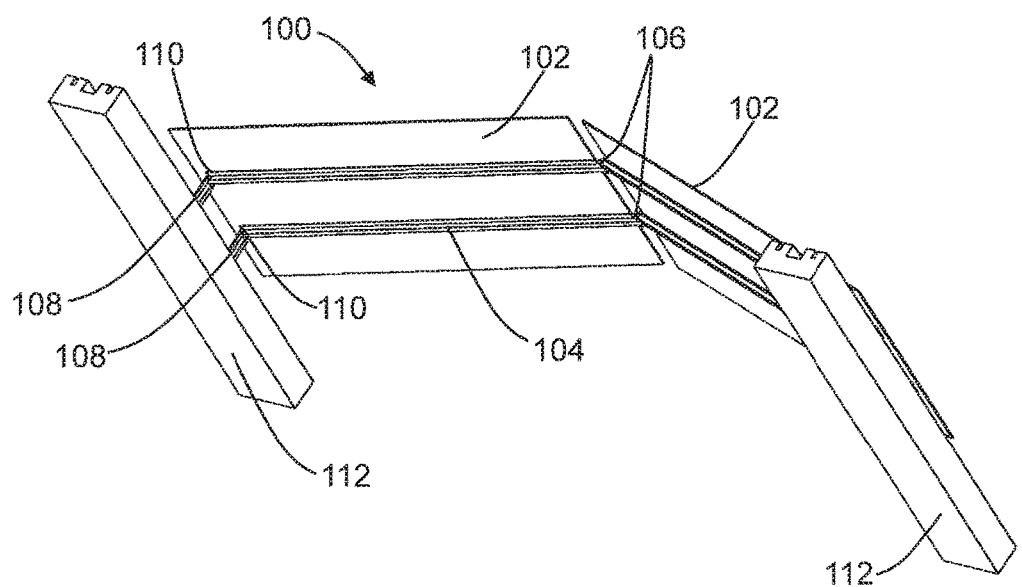

FIGS. 1A and 1B schematically illustrate perspective views of an individual dual tilt, ballasted racking system 100 holding first and second photovoltaic (PV) panels 102, according to certain configurations. FIG. 1A illustrates a top view of the system, and FIG. 1B illustrates an underside view of the system. Each of the first and second photovoltaic panels (also referred to as modules) 102 is coupled to and supported by at least first and second stiffeners 104. The PV panels 102 respectively can be fastened to the stiffener(s) 104 using any suitable coupling mechanism(s), such as adhesive or mechanical fasteners between the stiffeners and the frame of the PV panel, which frame can be or include metal. Each stiffener 104 meets and is rotatably coupled to another stiffener 104 at a location between the first and second photovoltaic panels 102 at a respective stiffener hinge 106. Each stiffener 104 can be rotatably connected to a respective foot 108 at a foot hinge 110.

Figure 12:
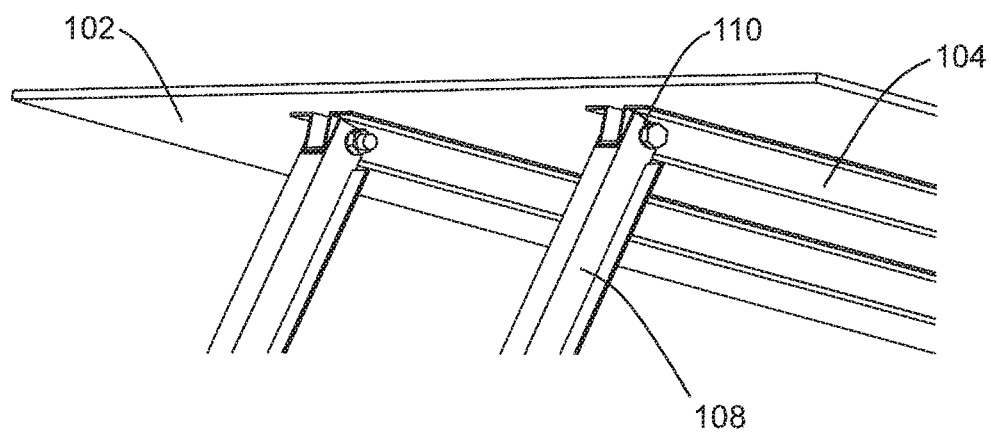
FIG. 12 schematically illustrates a perspective view of foot hinges rotatably coupling stiffeners to feet, according to certain configurations.

In some configurations, at least one of the stiffener hinge(s) 106 and the first and second foot hinges 110 optionally can include a respective mechanical stop inhibiting rotation of that hinge beyond a respective predetermined angle, e.g., so as to stop rotation approximately at an angle at which the system can be fixedly coupled to concrete ballast 112. FIG. 12 schematically illustrates a perspective view of foot hinges 110 rotatably coupling stiffeners to feet, according to certain configurations. The foot hinge 110 can be located near the end of the stiffener 104. The hinge is positioned so that the foot 108 can start in a folded position where it is substantially parallel to the stiffener 104 and under the panel. The foot hinge 110 allows the foot 108 to rotate to an angle between approximately 90° and 180° from the stiffener. For the panel to be at a 15° tilt, the foot 108 would be at a 105° angle from the stiffener 104. The foot can have a shape such that mechanical interference between it and the stiffener 104 occur when the foot 108 unfolds to the desired angle for installation.

Figure 14A:
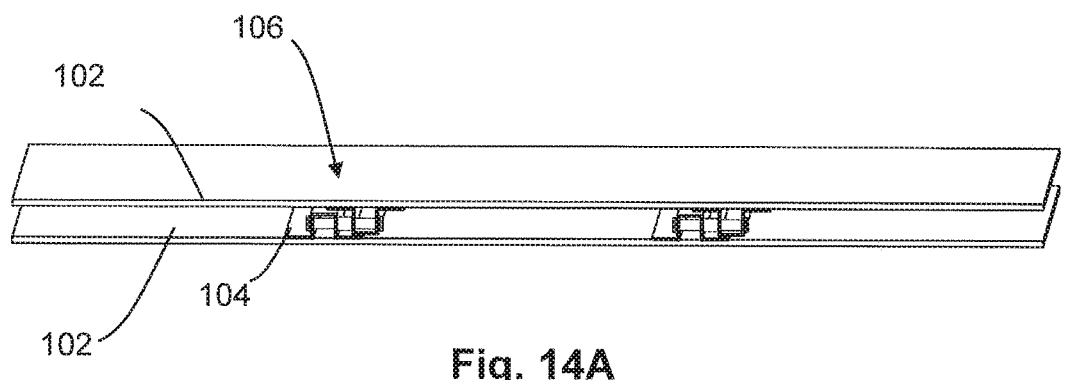
FIGS. 14A-14B schematically illustrate perspective views of a stiffener hinge, according to certain configurations.
Figure 14B:
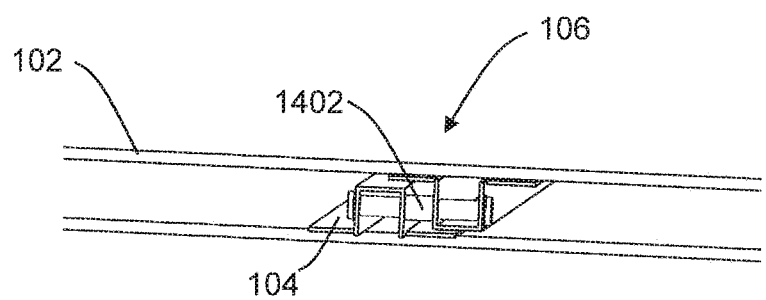

In some embodiments, the hinge mechanism between modules can include stiffeners 104, which may be offset from one another, joined by a rod. In various embodiments, the rod may be continuous and span the width of one or more modules, or there may be a short rod at each hinge location. In some embodiments, the rod may be held in place by one or more cotter pins or bent tabs. For example, FIGS. 14A-14B schematically illustrate perspective views of a stiffener hinge, according to certain configurations. Hinge 106 illustrated in FIGS. 14A-14B includes a hinge pin 1402 having a bent tab.

In some embodiments, the structural members that support the modules of a dual-orientation system may be mounted on a ballasted foundation. In one nonlimiting example, the ballasted foundation can include an extruded concrete rail that optionally may have grooves. The module support members may be secured to the ballasted foundation with an adhesive, such as construction epoxy, embedded in the concrete, bolted to the concrete, or otherwise suitably fastened to the concrete. For example, in FIGS. 1A-1B, each of the feet 108 can be coupled to a groove provided in a ballast, such as a concrete ballast foundation 112, each of which can have at least two grooves provided therein. The feet 108 can be adhered to the groove of the ballast with construction epoxy or another suitable type of adhesive. The feet 108 alternatively can be wet-set into the concrete, or a mechanical fastener can be used to attach the feet to another metal part that is fastened into the concrete. The ballast 112 can be or include precast concrete, concrete formed in place, or slip-formed concrete.

The particular angle of the photovoltaic modules relative to one another and to the ground can be determined, in part, by the respective angles of the foot hinges and stiffener hinge(s), the respective lengths of the feet and the photovoltaic modules, and the spacing of the ballasts from one another. In the nonlimiting configuration illustrated in FIGS. 1A-1B, the feet 108 are the same lengths as one another. However, one or more of the feet can have different lengths than one or more other of the feet, e.g., such as described with reference to FIGS. 15A-15D. Additionally, in the nonlimiting configuration illustrated in FIGS. 1A-1B, when the first and second feet respectively are coupled to the first and second grooves, the first and second stiffeners are at an angle of approximately 120-160 degrees to one another. As a result, the photovoltaic panels each can be at an angle of about 10-30 degrees relative to the ground. However, the system components readily can be adjusted so as to arrange the photovoltaic modules 102 at any other suitable angle(s) relative to the ground and/or relative to one another, e.g., as described with reference to FIGS. 15A-15D. The modules each can be arranged at a different, independently selected angle relative to the ground.

In the nonlimiting configuration illustrated in FIGS. 1A-1B, each photovoltaic module can be supported by one stiffener or by a plurality of stiffeners. For example, a first photovoltaic module 102 can be coupled to first and second elongated stiffeners 104 each of which is rotatably coupled to a respective foot via a foot hinge 110, and a second photovoltaic module 102 can be coupled to third and fourth elongated stiffeners 104 each of which is rotatably coupled to a respective foot via a foot hinge 110. The first stiffener 104 can be rotatably coupled to the third stiffener 104 via a first stiffener hinge 106, and the second stiffener 104 can be rotatably coupled to the fourth stiffener 104 via a second stiffener hinge 106. In the exemplary configuration illustrated in FIGS. 1A-1B, the stiffeners 104 attached to the first photovoltaic panel 102 can be parallel to one another and coupled to an underside of the first photovoltaic module; and the stiffeners attached to the second photovoltaic panel can be are parallel to one another and configured to be coupled to an underside of the second photovoltaic module. In other configurations such as described with reference to FIG. 7, the stiffeners can be coupled along edges of respective photovoltaic modules. Additionally, or alternatively, in configurations such as described with reference to FIG. 7 and/or FIGS. 9A-9B, the stiffeners can be coupled so as to support multiple photovoltaic modules.

Figure 2:
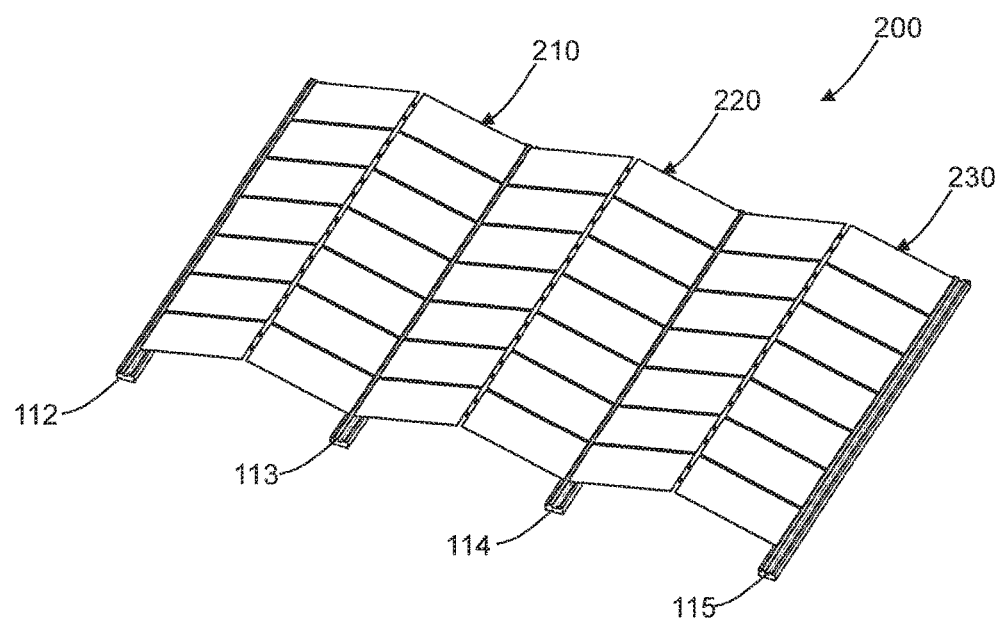
FIG. 2 schematically illustrates a perspective view of an assembly of dual tilt, ballasted racking systems such as illustrated in FIGS. 1A-1B, according to certain configurations.

In some embodiments, dual-orientation structures may span segments of ballasted foundation. Illustratively, a single section of ballasted foundation may support one module assembly, two module assemblies, or more than two module assemblies. In some embodiments, a module assembly can include two or more modules with folding support legs that are attached in a hinged configuration. For example, FIG. 2 schematically illustrates a perspective view of an assembly 200 of dual tilt, ballasted racking systems such as illustrated in FIGS. 1A-1B, according to certain configurations. As shown in FIG. 2, a number of dual tilt racking systems 210 can be aligned in rows on concrete ballasts 112 . . . 115. One or more of the concrete ballasts 112 . . . 115 can be shared by adjacent racking systems. For example, assembly 200 can include first, second, and third elongated ballasts 112, 113, 114 each having first and second grooves and arranged substantially parallel to one another. A first system 210 can be configured similarly as system 100 described with reference to FIGS. 1A-1B, system 700 described with reference to FIG. 7, or system 900 described with reference to FIGS. 9A-9B. For example, in a manner similar to that described with reference to FIGS. 1A-1B, first system 210 can include first and second elongated stiffeners 104 respectively coupled to and supporting first and second photovoltaic modules 102, and first and second feet 108 respectively coupled to the first groove of the first ballast 112 and the first groove of the second ballast 113. A first stiffener hinge 106 can rotatably couple the first and second stiffeners to one another, a first foot hinge 110 can rotatably couple the first foot 108 to the first stiffener 104, and a second foot hinge 110 can rotatably couple the second foot 108 to the second stiffener 104. A second system 220 can be configured similarly as the first system 210 and can share the second ballast 113 with the first system 210. For example, second system 220 can include third and fourth elongated stiffeners 104 respectively coupled to and supporting third and fourth photovoltaic modules 102, and third and fourth feet respectively coupled to the second groove of the second ballast 113 and the first groove of the third ballast 114. A second stiffener hinge 106 can rotatably couple the third and fourth stiffeners 104 to one another, a third foot hinge 110 can rotatably couple the third foot 108 to the third stiffener 104, and a fourth foot hinge 110 can rotatably couple the fourth foot 108 to the fourth stiffener 104. The stiffener hinges 106 and/or foot hinges optionally can include respective mechanical stops inhibiting rotation of those hinges beyond a respective predetermined angle in a manner such as provided herein.

It should be appreciated that any suitable number of support systems can be coupled to any of the ballasts 112 . . . 115 in like manner. For example, a plurality of systems 210 can be arranged adjacent and parallel to one another along the first and second ballasts 112, 113, and a plurality of systems 220 can be arranged adjacent and parallel to one another along the second and third ballasts 113, 114 and can share the second ballast with systems 210. Similarly, a plurality of systems 230 can be arranged adjacent and parallel to one another along the third and fourth ballasts 114, 115 and can share the third ballast with systems 220. Accordingly, by providing any suitable number of ballasts shared by support systems as provided herein, a solar power plant can be scaled to any desired size with a relatively low number of components and with relative ease of installation such as described with reference to FIGS. 5-6.

Figure 3:
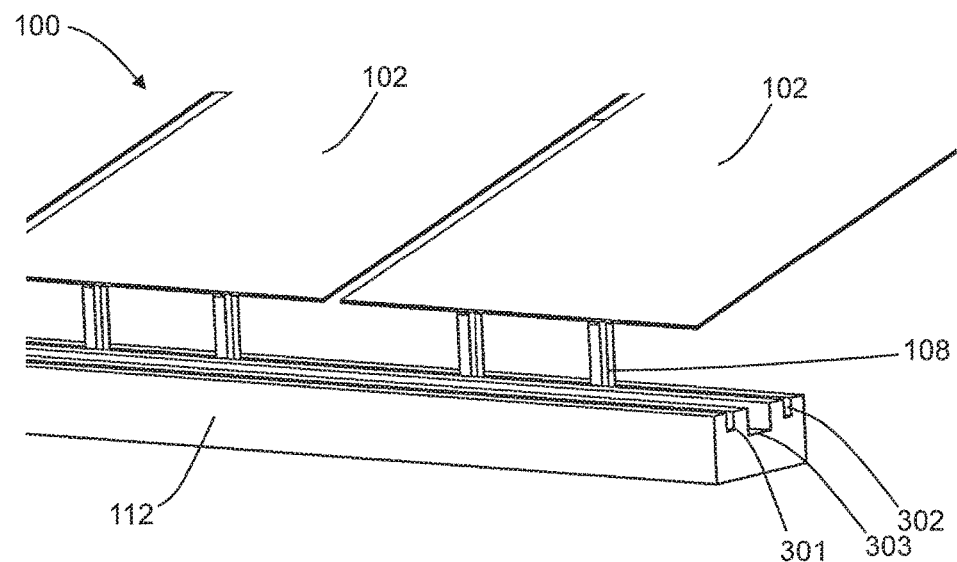
FIG. 3 schematically illustrates a perspective view of certain components of an assembly of dual tilt, ballasted racking systems holding photovoltaic panels, according to certain configurations.

FIG. 3 schematically illustrates a perspective view of certain components of an assembly of dual tilt, ballasted racking systems holding photovoltaic panels, according to certain configurations. More specifically, FIG. 3 schematically illustrates a detailed view of the sides of multiple dual tilt racking systems 100. Photovoltaic (PV) panels 102 are supported by stiffeners (not shown) which are connected to feet 108, which stand in grooves of the ballast 112. Feet from multiple racking systems can be located in the same groove in the ballast 112, e.g., such as described with reference to FIGS. 2 and 8. In the example illustrated in FIG. 3, one exemplary configuration of ballast 112 consists essentially of concrete having three parallel grooves provided therein. First and second grooves 301, 302 can have substantially the same dimensions as one another and can be configured so as to receive respective feet of photovoltaic support structures such as described herein with reference to FIG. 1, 7, or 9, for examples. Third groove 303 can be disposed between first and second grooves 301, 302 and can be configured so as to receive a vehicle wheel such as described with reference to FIG. 11, e.g., can be deeper and wider than the first and second grooves 301, 302.

Figure 4A:
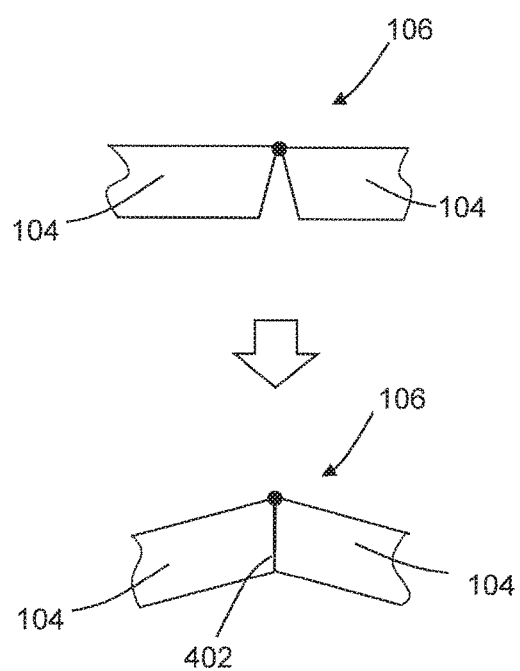
FIGS. 4A and 4B respectively schematically illustrate perspective views of alternative embodiments of a hinge for use in a dual tilt, ballasted racking system, according to certain configurations.
Figure 4B:
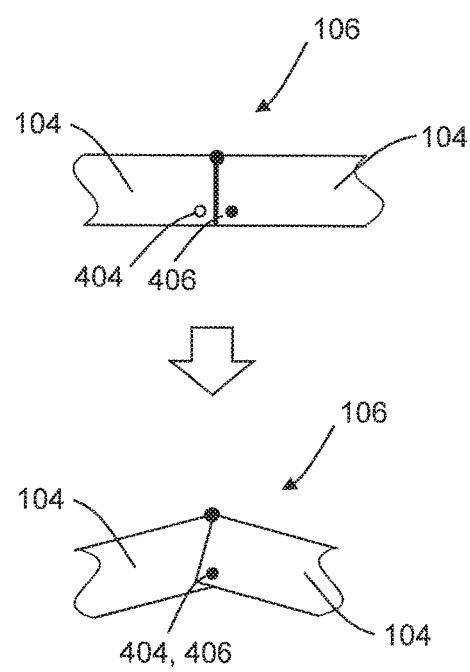

In some embodiments, the hinge mechanism between modules may include a locking mechanism that locks the structural members in an angled position. This locking mechanism may resist the weight of the modules and keep the hinged connection at the proper angle. For example, FIGS. 4A-4B respectively schematically illustrate perspective views of alternative embodiments of a hinge for use in a dual tilt racking system, according to certain configurations. More specifically, FIGS. 4A-4B schematically illustrate detailed views of two different embodiments of the stiffener hinge 106 with the PV panels omitted for clarity. When unfolding the dual-tilt racking system 100, a mechanical lock can be used to secure the two stiffeners 104 at the appropriate angle relative to one another. FIG. 4A schematically illustrates images of a fully-unfolded embodiment (top) and an embodiment of the stiffeners at angle for deployment (bottom). The edges of the stiffeners 104 are formed so as to lock with one another when they are aligned. For example, the stiffeners 104 can lock because of mechanical interference of the ends of the stiffener pieces and/or because of folded pieces at the ends of the stiffeners which interfere mechanically with one another at 402. FIG. 4B schematically illustrates detailed side views of an alternative embodiment of the stiffener hinge. The top image of FIG. 4B illustrates the two stiffeners 104 fully unfolded, and the bottom image of FIG. 4B illustrates the two stiffeners angled and locked in the angle appropriate for deployment. In this embodiment, one of the stiffeners 104 includes a hole 404 near the end. The other stiffener 104 includes a corresponding pin mechanism 406. The hole and pin are arranged so that when the pin 406 is aligned with the hole 404, the pin slides into the hole to create a mechanical lock and to inhibit or prevent the two stiffeners from rotating with respect to one another. The pin 406 can be actuated by a spring, by hand, or by other means. Configurations for locking two stiffeners 104 such as shown in FIGS. 4A and 4B can also or alternatively be used to lock a foot 108 with a stiffener 104 at the foot hinge 110.

In some embodiments, modules can have racking hardware attached to them before they are shipped to the power plant site in a folded position. Racking hardware may be attached to one or more of the module back surface, to one side, to two sides, or in other configurations. In some embodiments, hinged units including one or more modules may be configured so as to snap together during the installation process. In some embodiments, two or more modules that are attached together can be folded into a compact configuration for shipping. For example, modules can be shipped from the factory with mounting hardware (e.g., racking hardware) pre-installed so that they can simply be unfolded and put in place at the power plant site. In some embodiments, mounting hardware can include, for example, processed sheet metal, hat channel, module mounting clamps, and/or other materials. In some embodiments, modules may be shipped from the factory (e.g., with mounting hardware installed) in groups of two or more modules or as single modules.

Figure 5:
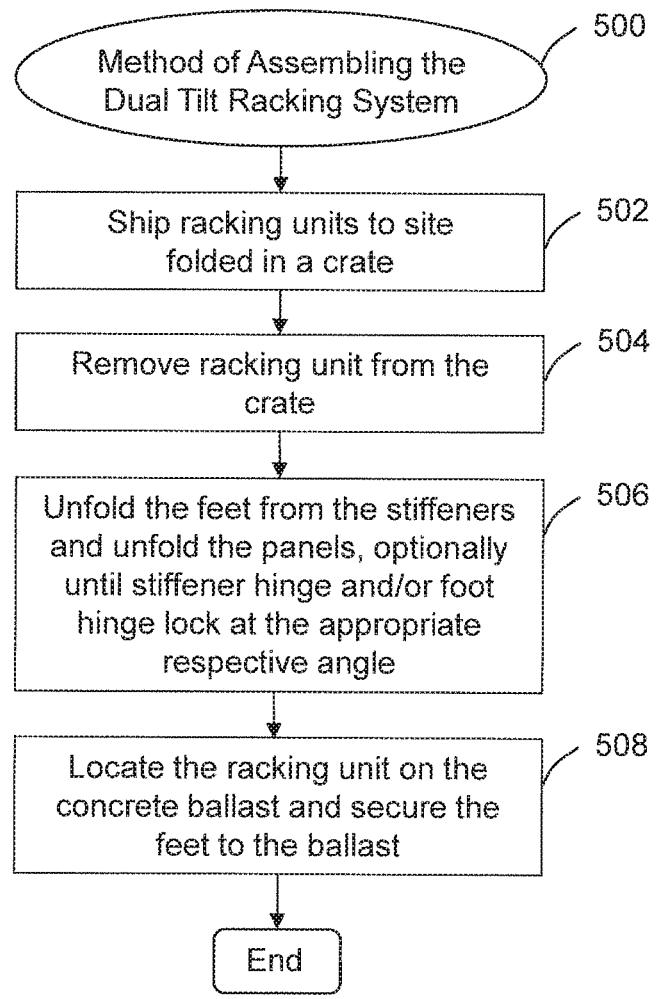
FIG. 5 illustrates a flow of exemplary operations in a method for assembly and installation of a dual tilt, ballasted racking system, according to certain configurations.
Figure 6:
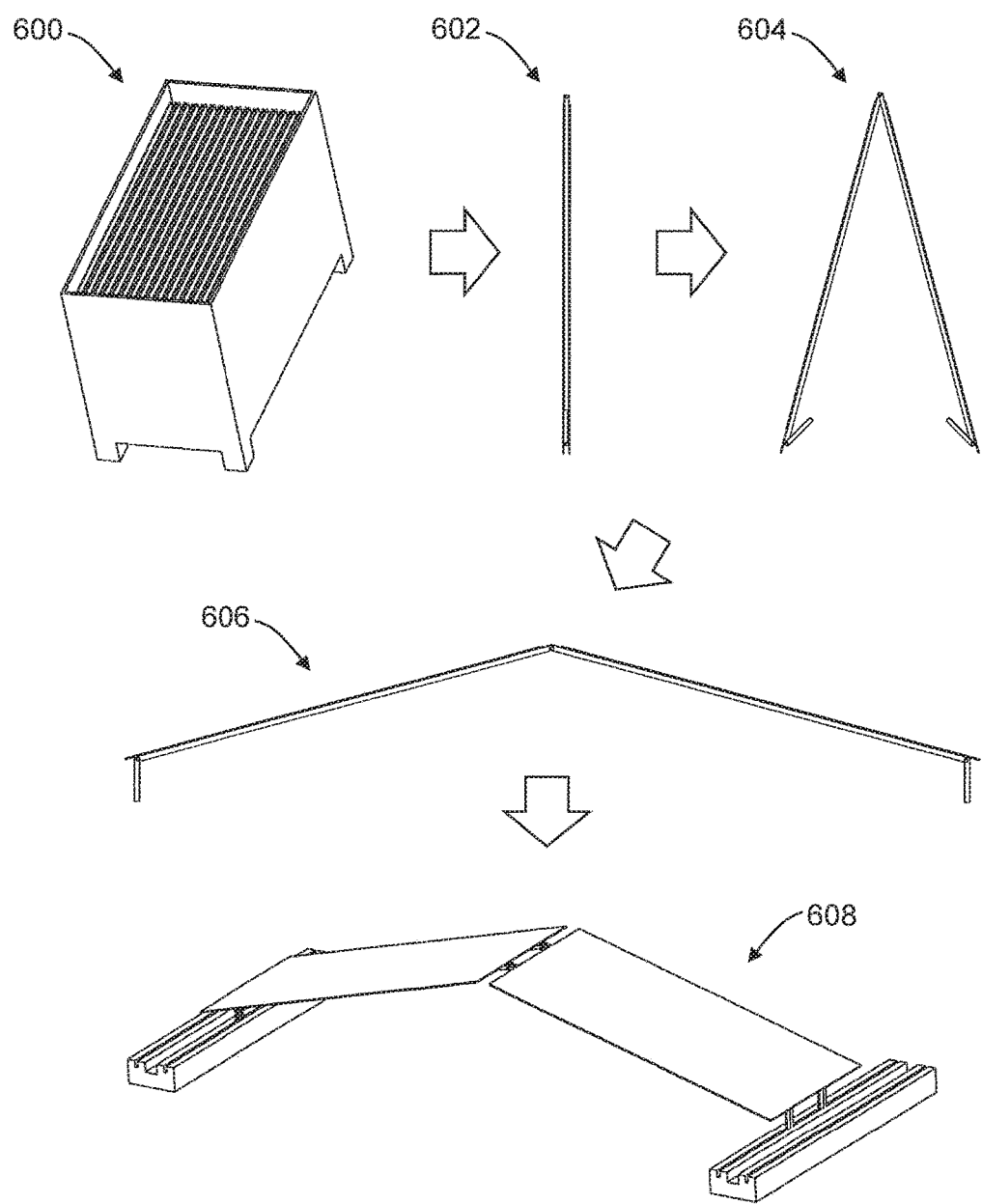
FIG. 6 illustrates a dual tilt, ballasted racking system during different stages of assembly and installation, according to certain configurations.

In some embodiments, modules may be put into a folded position for more efficient packaging and shipment from the factory to the power plant installation site. For example, modules may be packaged and folded in assemblies that include two or more modules (with one or more structural supports and legs attached) or they may be packaged as single modules (with one or more structural supports and legs attached). For example, FIG. 5 illustrates a flow of exemplary operations in a method 500 for assembly and installation of a dual tilt, ballasted racking system and FIG. 6 illustrates a dual tilt, ballasted racking system during different stages of assembly and installation (such as during the operations of FIG. 5), according to certain configurations. Any suitable racking system can be assembled and installed, e.g., such as described with reference to FIG. 1, 7, or 9A-9B. First, fully-folded racking systems packaged in a crate are shipped to site for assembly (operation 502 of FIG. 5). A crate of such racking systems is illustrated at stage 600 of FIG. 6. Each folded racking system can be prepared, for example, by respectively folding the feet of that system parallel to the photovoltaic modules by rotating the respective foot hinges; and respectively folding the stiffeners of that system parallel to one another by rotating the stiffener hinge(s). Alternatively, each racking system can be assembled in a completely folded or partially folded state, and any remaining folding completed prior to packaging the racking system into the crate. Any suitable number of the folded systems (e.g., first and second photovoltaic modules coupled to folded first and second stiffeners coupled to folded first and second feet) can be packed into a crate which then is shipped to a site for assembly.

Next, a racking system is removed from a crate (operation 504 of FIG. 5), e.g., such as illustrated at stage 602 of FIG. 6. Such operation can include, for example, removing the first and second photovoltaic modules coupled to the folded first and second stiffeners coupled to the folded first and second feet from the shipped crate. Next, the feet are unfolded from the stiffeners, and the stiffeners are unfolded from one another (operation 506 of FIG. 5), e.g., such as illustrated at stage 604 of FIG. 6. Such unfolding steps need not be performed simultaneously as one another. Such operation can include, for example, respectively unfolding the first and second feet by rotating the first and second foot hinges (at the same time or at different times than one another); and unfolding the first and second stiffeners by rotating the first stiffener hinge (at the same time or at different times than the feet are unfolded). Optionally, the stiffener hinge(s) and/or foot hinge(s) are rotated until they lock in place at the appropriate respective angle (operation 506 of FIG. 5), e.g., angles such as illustrated at stage 606 of FIG. 6. The racking system is located at the desired spot on the concrete ballast and fastened in place on the concrete ballast (operation 508 of FIG. 5), e.g., as illustrated at stage 608 of FIG. 6. For example, the unfolded first foot can be inserted into the groove of a first ballast and secured thereto, e.g., adhered thereto, and the unfolded second foot can be inserted into the groove of a second ballast and secured thereto, e.g., adhered thereto. It should be appreciated that any suitable number of racking systems can be shipped, unfolded, and coupled to any suitable number of ballasts so as to provide an assembly of racking systems.

Figure 7:
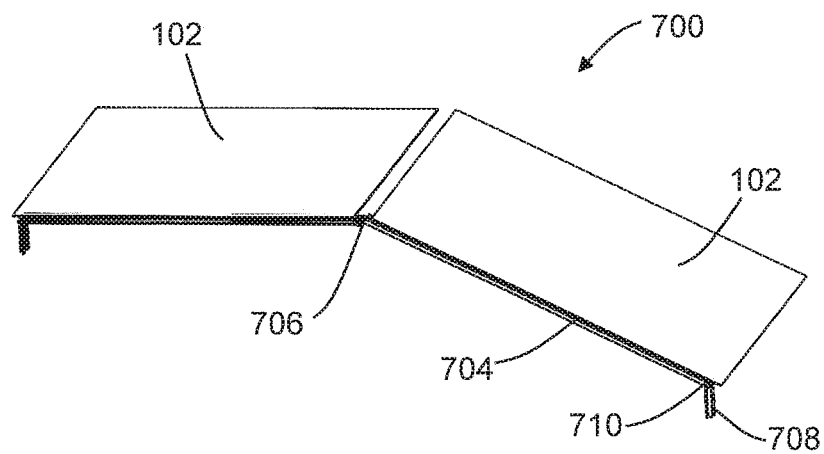
FIG. 7 schematically illustrates a perspective view of an alternative dual tilt, ballasted racking system, according to certain configurations.

In some embodiments, racking hardware (e.g., structural components) may be attached to one or more of the module back surface (e.g., as illustrated in FIGS. 1A-1B), to one side, to two sides, or in other suitable configurations. For example, FIG. 7 schematically illustrates a perspective view of an alternative dual tilt racking system 700, according to certain configurations. This configuration includes first and second PV panels 102 that respectively are coupled to and supported by first and second stiffeners 704. Stiffeners 704 are joined between the panels at a stiffener hinge 706 and that are joined at respective foot hinges 710 to feet 708 at the ends of the stiffeners. In this configuration, only one stiffener 704 is mounted on each respective PV panel 102 and is secured at the edge of the panel. The stiffener 704 can be secured to the respective PV panel 102 with adhesive, with fasteners attached to the frame of the panel, or with clamps or clips that use a friction grip on the PV panel and a fastener on the stiffener, or otherwise suitably secured to the panel.

Figure 8:
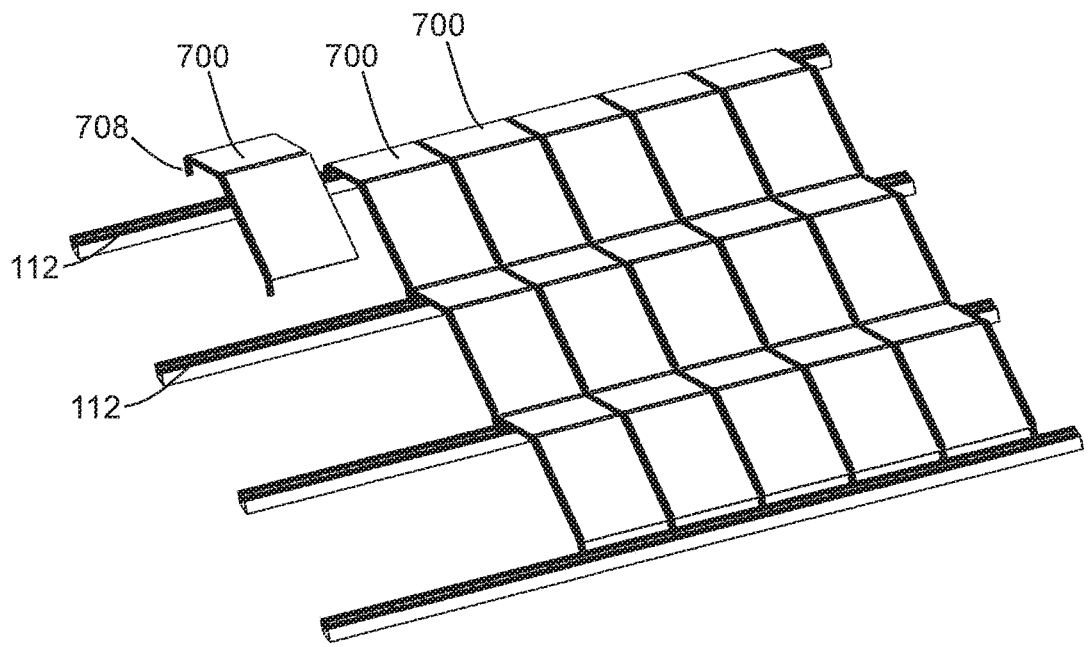
FIG. 8 schematically illustrates perspective view of an assembly of dual tilt, ballasted racking systems such as illustrated in FIG. 7, according to certain configurations.

FIG. 8 schematically illustrates perspective view of an assembly of dual tilt racking systems such as illustrated in FIG. 7, according to certain configurations. Similarly as in FIG. 2, the feet 708 of the racking system 700 are secured to a ballast 112 (e.g., within a groove of a concrete ballast). As shown in FIGS. 7 and 8, the first racking system 700 placed on the concrete ballast 112 can include first and second stiffeners 704 located along respective edges of first and second PV panels 102. An additional racking system disposed adjacent to the first racking system can be configured similarly as the first racking system 700, and can share the stiffeners 704 of the first racking system, which are exposed. Accordingly, the first stiffener of a first racking system can be configured to be coupled to and support both a first photovoltaic module of the first racking system and a first photovoltaic module of an adjacent racking system; and the second stiffener of the first racking system can be configured to be coupled to and support both a second photovoltaic module of the first racking system and a second photovoltaic module of the adjacent racking system.

Figure 9A:
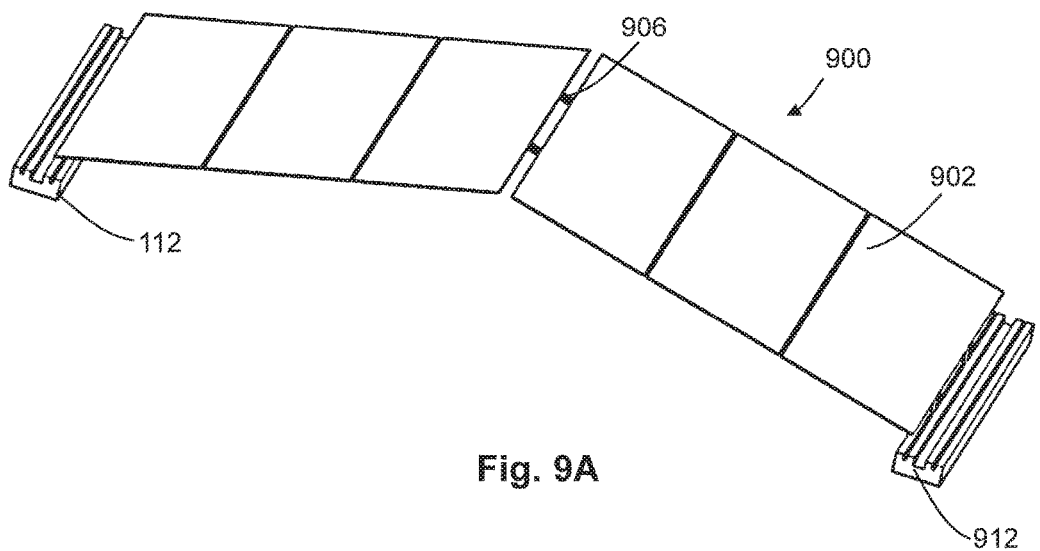
FIGS. 9A and 9B schematically illustrate perspective views of another alternative embodiment of a dual tilt, ballasted racking system, according to certain configurations.
Figure 9B:
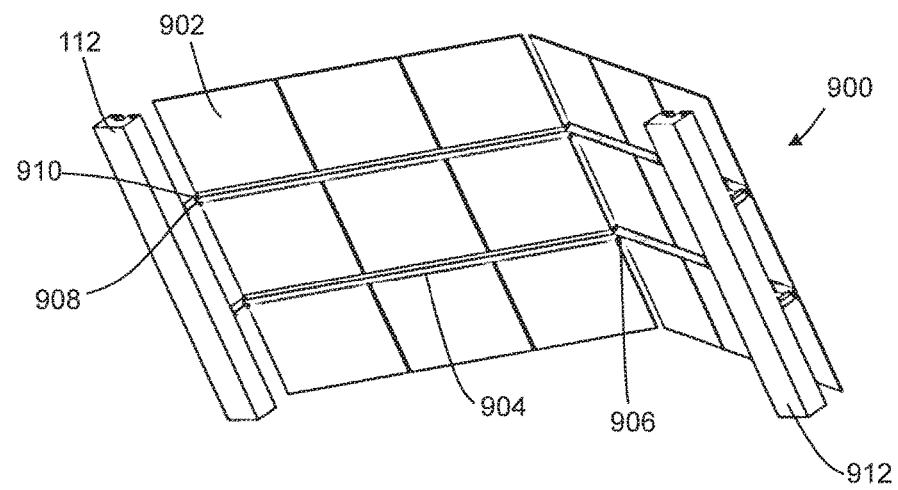

FIGS. 9A and 9B schematically illustrate perspective views of another alternative embodiment of a dual tilt, ballasted racking system 900, according to certain configurations. FIG. 9A illustrates a top view of system 900, and FIG. 9B illustrates a view of the underside of system 900. In this embodiment, multiple solar panels 902 can be mounted on each side of the racking system. For example, a first stiffener 904 of system 900 can be configured to support at least first and second photovoltaic modules, and optionally three or more photovoltaic modules, and a second stiffener 904 of system 900 can be configured to support at least first and second photovoltaic modules, and optionally three or more photovoltaic modules. Such an arrangement can be used to form a relatively large racking system or to enable the use of relatively small form-factor PV panels. Similar to the example shown in FIGS. 1A-1B, each side of the racking system 900 can include stiffeners 904 connected to the underside of photovoltaic modules 902, and respectively are rotatably coupled by stiffener hinges 906 to stiffeners 904 of the other side of the racking system. Each stiffener 904 is rotatably coupled to a respective foot 908 at a foot hinge 910. The feet 908 stand on ballasts 912, e.g., within a groove of a concrete ballast such as described elsewhere herein.

In some embodiments, a ballasted dual-tilt system may be configured such that it is compatible with operation and maintenance vehicles. For example, a cleaning vehicle may be configured to travel on one or more ballasted rails to clean the modules. The cleaning vehicle may be supported by the structural members at the top of the arch where the two slopes meet. A vegetation management vehicle may be configured to be supported by the rails and travel under the PV modules. In some embodiments, the ballasted rails may also or alternatively serve as pathways for system technicians to walk on.

Figure 10:
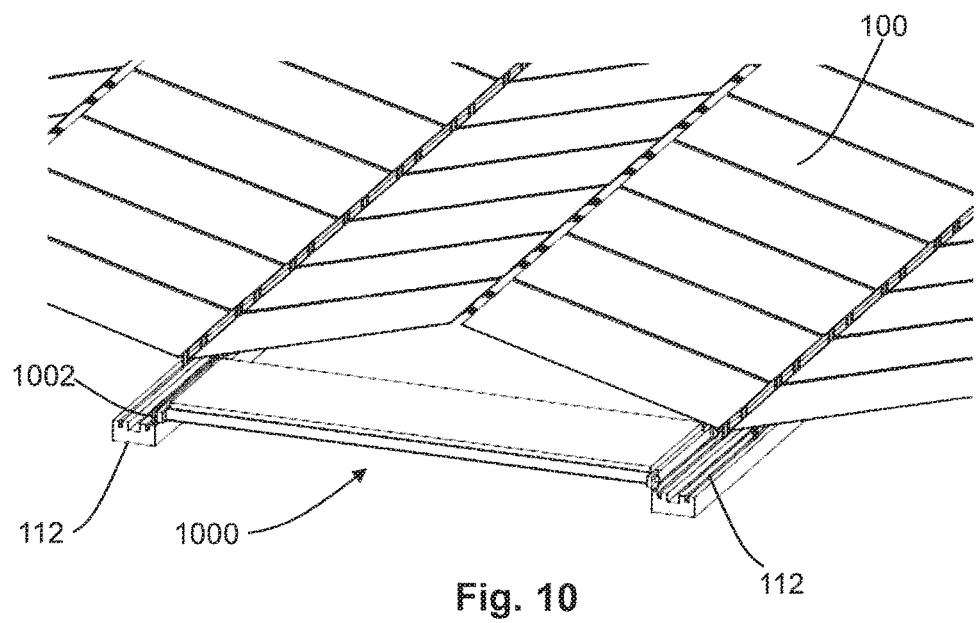
FIG. 10 schematically illustrates a perspective view of an assembly of dual tilt, ballasted racking systems such as illustrated in FIGS. 1A-1B together with an exemplary vehicle, according to certain configurations.

For example, FIG. 10 schematically illustrates a perspective view of an assembly of dual tilt racking systems such as illustrated in FIGS. 1A-1B together with an exemplary vehicle 1000, such as a maintenance vehicle configured to clean the assembly, according to certain configurations. The vehicle 1000 includes four wheels or wheel sets 1002, and these wheels can roll along the ballast 112, which also acts as a track. For example, vehicle 1000 can include first and second wheels contacting a first ballast 112, third and fourth wheels contacting a second ballast, and a body coupled to the first, second, third, and fourth wheels. The wheels and track act to support the vehicle 1000 and to guide it as it moves along the ballast 112. The vehicle can be self-powered, such as with a battery or with an engine, or can be externally powered, such as by people or by electrical wires. An on-board battery could be swapped out, charged by a charger connected to an external source, or charged by an onboard solar panel. The vehicle 1000 can include a control system and communications system so that the vehicle can operate autonomously, collect data, and transmit data. The body of vehicle 1000 can be configured to pass under the first and second photovoltaic modules as the vehicle drives along the first and second ballasts. In the example shown in FIG. 10, vehicle 1000 is short enough to fit under the dual tilt racking systems 100 so that it can travel down an entire row without disturbing any equipment. The maintenance vehicle 1000 can be used for a variety of tasks such as trimming vegetation, deploying herbicide, deploying insecticide, capturing visible-spectrum or infrared images of the ground, structure, or solar panels, carrying a person, carrying equipment, or conducting other maintenance or diagnostic tasks. It should be appreciated that vehicle 1000 can be used with an assembly of any suitable racking systems, e.g., such as illustrated in FIG. 1, 7, or 9A-9B.

Figure 11:
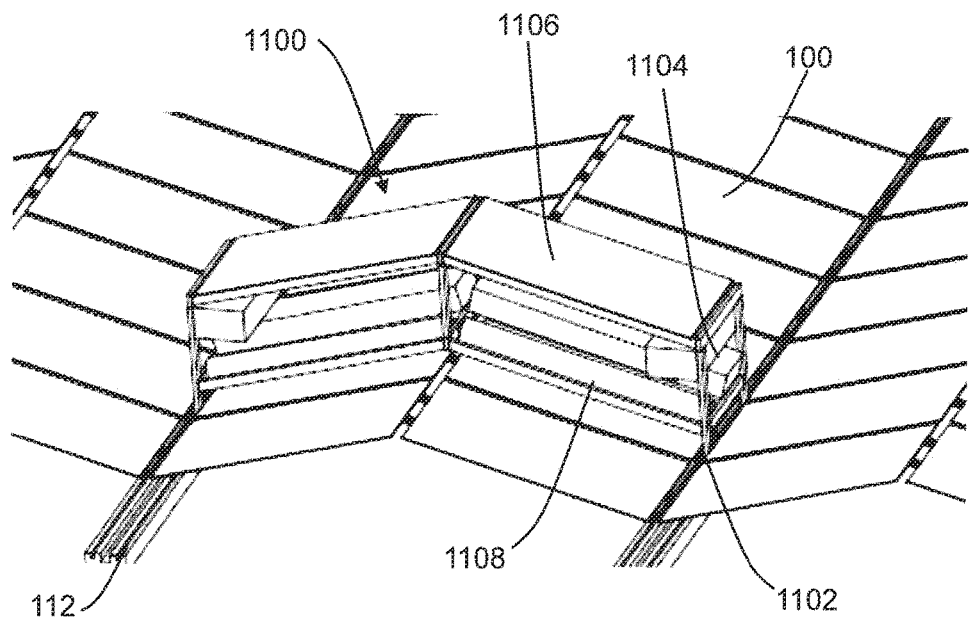
FIG. 11 schematically illustrates a perspective view of an assembly of dual tilt, ballasted racking systems such as illustrated in FIGS. 1A-1B together with another exemplary vehicle configured to clean the assembly, according to certain configurations.

FIG. 11 schematically illustrates a perspective view of an assembly of dual tilt racking systems such as illustrated in FIGS. 1A-1B together with another exemplary vehicle 1100, such as a maintenance vehicle configured to clean the assembly, according to certain configurations. FIG. 11 schematically illustrates a perspective view of multiple rows of dual tilt racking systems 100 arranged on ballast 112. A vehicle 1100 is shown located on the concrete tracks 112 and above the solar racking systems. The vehicle 1100 includes four wheels or wheel sets 1102 that roll on the ballast 112. The wheels and track support the vehicle and guide it down the row. For example, vehicle 1100 can include first and second wheels contacting a first ballast 112, third and fourth wheels contacting a second ballast 112, and a body coupled to the first, second, third, and fourth wheels. The third and fourth wheels can contact the second ballast 112 within a gap between the photovoltaic module of a first racking system and the photovoltaic module of a second racking system that shares the second ballast with the first racking system. Optionally, the ballasts 112 can include grooves configured to receive wheels of vehicle 1100, e.g., groove 303 such as illustrated in FIG. 3. For example, the first and second wheels of the vehicle can contact the groove of a first ballast 112, and the third and fourth wheels of the vehicle can contact the fourth groove of a second ballast 112. The body of vehicle 1100 can be configured to pass over the photovoltaic modules coupled to those ballasts as the vehicle drives along those ballasts.

The maintenance vehicle 1100 illustrated in FIG. 11 can be powered and controlled similarly as the maintenance vehicle 1000 shown in FIG. 10. For example, solar panels 1106 can partially or wholly power the vehicle. The vehicle 1100 can also include power electronics 1104, a control system, and other onboard equipment. The vehicle 1100 can be used to clean the solar panels, with cleaning implements 1108. Additionally, or alternatively, the vehicle 1100 can also be used to capture images of the panels, infrastructure, or surrounding environment either in the visible spectrum or in the infrared spectrum. Additionally, or alternatively, the vehicle 1100 can be used to clear snow. Additionally, or alternatively, the vehicle can also be used to transport workers, transport equipment, or to carry panels or racking systems that have been removed from the overall system. It should be appreciated that vehicle 1100 can be used with an assembly of any suitable racking systems, e.g., such as illustrated in FIG. 1, 7, or 9A-9B.

Figure 13A:
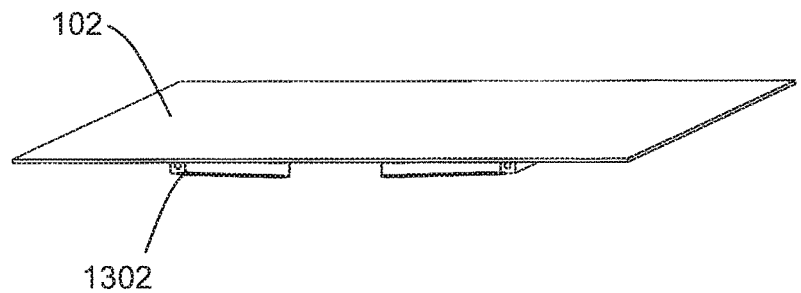
FIGS. 13A-13C schematically illustrate perspective views of alternative foot hinges, according to certain configurations.
Figure 13B:
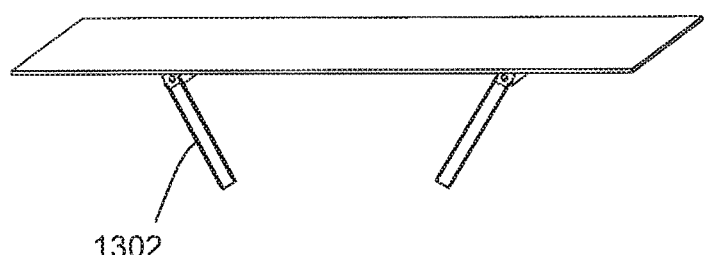
Figure 13C:
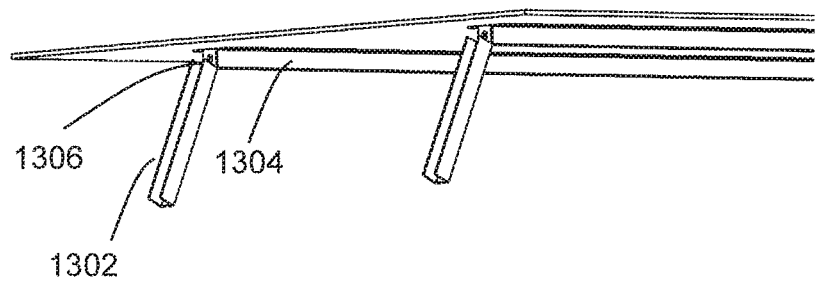

FIGS. 13A-13C schematically illustrate perspective views of alternative foot hinges, according to certain configurations, in which 1302 is a foot, 1304 is a stiffener, and 1306 is the foot hinge. In one example, the feet 1302 rotate 90 degrees from a folded position for shipping to an unfolded position for installation. The axis of rotation can be about an axis parallel to or perpendicular to the long dimension of the stiffener 1304. In one example, the foot 1302 can have a bent tab on the end, and a fastener (such as a bolt), can go through this tab and through a tab on the end of the stiffener 1304. The fastener can serve both to connect the foot to the stiffener at hinge 1306 and also to serve as the pivot point for rotation of the hinge. With such a foot design, a locking mechanism can be omitted at the stiffener hinge between the panels.

Note that a dual-orientation system may include hinged legs that, in their stored or folded position, are perpendicular to the structural members that are attached to the module. During installation, magnets can be used to manage the foldable legs, e.g., in a manner such as described in U.S. Pat. No. 9,453,660, the entire contents of which are incorporated by reference herein. The legs can be any suitable length so that the modules are positioned at any desired height above the ground. The hinges between the legs and structural members can include a grounding mechanism that forms a continuous electrical path between the components, e.g., in a manner such as described in US patent publication no. 2016/0365823, the entire contents of which are incorporated by reference herein.

In some embodiments, a hinged connection between modules (with optional attachment of structural members and support legs) may be used in a single-tilt configuration. The assembly can fold into a compact configuration for shipment in a manner similar to that described above with reference to FIGS. 5-6. For example, FIGS. 15A-15D schematically illustrate an alternative ballasted racking system, according to certain configurations. Similarly as for racking system 100 described with reference to FIGS. 1A-1B, each of the first and second photovoltaic modules 102 is coupled to and supported by at least first and second stiffeners 1508. Each stiffener 1508 meets and is rotatably coupled to another stiffener 1508 at a location between the first and second photovoltaic panels 102 at a respective stiffener hinge 1506. The stiffeners 1508 of a first photovoltaic module 102 can be rotatably connected to respective feet 1502 at foot hinges (not specifically labeled), and stiffeners 1508 of a second photovoltaic module 102 can be rotatably connected to respective feet 1504 at foot hinges (not specifically labeled). Feet 1502 and feet 1504 can be different lengths than one another. For example, the front legs 1502 can be shorter than the rear legs 1504. When the feet 1502 and 1504 respectively are coupled to the grooves of ballasts (not shown), the first and second stiffeners are at an angle of approximately 180 degrees to one another, and as a result the photovoltaic modules 102 can be substantially parallel to one another. Illustratively, a system such as shown in FIGS. 15A-15D can be oriented toward the equator, e.g., pointed South in the Northern Hemisphere. The photovoltaic modules 102 can be in the same plane as one another in the illustrated configuration, but it should be appreciated that the modules could be oriented at different angles than one another (e.g., can be at a 15 degree tilt and a 30 degree tilt or other suitable angles, respectively). In either single-tilt or dual-tilt configurations, the modules optionally may be used to block or deflect wind at the edges of the power plant system or array section.

In exemplary embodiments such as illustrated in FIGS. 2, 8, and 9A-9B, a dual-tilt photovoltaic system can include a foundation that includes one or more, or two or more, ballasted rails. The groups of modules, or arrays (or assemblies) may have a height of one module, or they may include any suitable number of columns of two or more modules. For example, FIGS. 9A-9B depict an embodiment of a system that utilizes columns that include or are composed of three modules. Any suitable number of columns, each including any suitable number of modules, can be included.

Some embodiments of a dual-orientation system, such as illustrated in FIGS. 1A-1B and 9A-9B, may include one or more structural members (such as stiffeners) that are attached to the back surface (such as the backsheet or glass surface) of the modules. These members can include hinged mechanisms (such as stiffener hinges) that, for example, can allow two attached modules to fold relative to each other. Hinged mechanisms (such as foot hinges) can also or alternatively allow support legs (such as feet) to rotate between stowed and deployed positions. The slope of the modules may be greater or less than the slope of the exemplary modules shown in FIGS. 1A-1B and 9A-9B.

In one exemplary configuration, a system is provided for supporting first and second photovoltaic modules. The system can include first and second elongated stiffeners respectively configured to be coupled to and support the first and second photovoltaic modules. The system also can include first and second feet respectively configured to be coupled to first and second grooves respectively provided within first and second ballasts. The system also can include a first stiffener hinge rotatably coupling the first and second stiffeners to one another, a first foot hinge rotatably coupling the first foot to the first stiffener, and a second foot hinge rotatably coupling the second foot to the second stiffener. At least one of the first stiffener hinge and the first and second foot hinges can include a respective mechanical stop inhibiting rotation of that hinge beyond a respective predetermined angle. Examples of such a system are provided herein with reference to FIGS. 1A-1B, 2, 3, 4A-4B, 7, 8, 9A-9B, 12, 13A-13C, 14A-14B, and 15A-15D.

In another exemplary configuration, a method is provided for supporting first and second photovoltaic modules. The method can include providing first and second elongated stiffeners respectively configured to be coupled to the first and second photovoltaic modules so as respectively to support the first and second photovoltaic modules. The method also can include respectively coupling first and second feet to first and second grooves respectively provided within first and second ballasts. The first and second stiffeners can be rotatably coupled to one another with a first stiffener hinge, the first foot and the first stiffener can be rotatably coupled to one another with a first foot hinge, and the second foot and the second stiffener can be rotatably coupled to one another with a second foot hinge. At least one of the first stiffener hinge and the first and second foot hinges can include a respective mechanical stop inhibiting rotation of that hinge beyond a respective predetermined angle. Examples of such a method are provided herein with reference to FIGS. 1A-1B, 2, 3, 4A-4B, 5, 6, 7, 8, 9A-9B, 12, 13A-13C, 14A-14B, and 15A-15D.

In yet another exemplary configuration, an assembly is provided for supporting photovoltaic modules. The assembly can include first, second, and third elongated ballasts, each including first and second grooves and being arranged substantially parallel to one another. A first system of the assembly can include first and second elongated stiffeners respectively coupled to and supporting first and second photovoltaic modules and first and second feet respectively coupled to the first groove of the first ballast and the first groove of the second ballast, as well as a first stiffener hinge rotatably coupling the first and second stiffeners to one another, a first foot hinge rotatably coupling the first foot to the first stiffener, and a second foot hinge rotatably coupling the second foot to the second stiffener. A second system of the assembly can include third and fourth elongated stiffeners respectively coupled to and supporting third and fourth photovoltaic modules and third and fourth feet respectively coupled to the second groove of the second ballast and the first groove of the third ballast, as well as a second stiffener hinge rotatably coupling the third and fourth stiffeners to one another, a third foot hinge rotatably coupling the third foot to the third stiffener, and a fourth foot hinge rotatably coupling the fourth foot to the fourth stiffener. Examples of such an assembly are provided herein with reference to FIGS. 2, 3, 8, 10, and 11.

In still another exemplary configuration, a method is provided for supporting photovoltaic modules. The method can include providing first, second, and third elongated ballasts, each including first and second grooves and being arranged substantially parallel to one another. The method can include providing a first system, the providing of which can include providing first and second elongated stiffeners respectively configured to be coupled to first and second photovoltaic modules so as respectively to support the first and second photovoltaic modules; and respectively coupling first and second feet to the first groove of the first ballast and the first groove of the second ballast. The first and second stiffeners can be rotatably coupled to one another with a first stiffener hinge, the first foot and the first stiffener can be rotatably coupled to one another with a first foot hinge, and the second foot and the second stiffener can be rotatably coupled to one another with a second foot hinge. The method also can include providing a second system, the providing of which can include providing third and fourth elongated stiffeners configured to be coupled to third and fourth photovoltaic modules so as respectively to support the third and fourth photovoltaic modules, and respectively coupling third and fourth feet to the second groove of the second ballast and the first groove of the third ballast. The third and fourth stiffeners can be rotatably coupled to one another with a second stiffener hinge, the third foot and the third stiffener can be rotatably coupled to one another with a third foot hinge, and the fourth foot and the fourth stiffener can be rotatably coupled to one another with a fourth foot hinge. Examples of such a method are provided herein with reference to FIGS. 2, 3, 5, 6, 8, 10, and 11.

While various illustrative embodiments of the invention are described herein, it will be apparent to one skilled in the art that various changes and modifications may be made therein without departing from the invention. For example, the present systems and methods are not limited to use with photovoltaic modules, and instead can be applied to solar collectors including any type of solar module (e.g., a module such as used with a concentrated solar power system, such as a parabolic trough or heliostat), or any other type of structure. All such changes and modifications that fall within the true spirit and scope of the invention are encompassed by the following claims.

What is claimed is:

1. An assembly for supporting photovoltaic modules, comprising:
   first, second, and third elongated ballasts, each comprising first and second grooves and being arranged substantially parallel to one another;
   a first system comprising:
      first and second elongated stiffeners respectively coupled to and supporting first and second photovoltaic modules;
      first and second feet respectively coupled to the first groove of the first ballast and the first groove of the second ballast;
      a first stiffener hinge rotatably coupling the first and second stiffeners to one another;
      a first foot hinge rotatably coupling the first foot to the first stiffener; and
      a second foot hinge rotatably coupling the second foot to the second stiffener;
   a second system comprising:
      third and fourth elongated stiffeners respectively coupled to and supporting third and fourth photovoltaic modules;
      third and fourth feet respectively coupled to the second groove of the second ballast and the first groove of the third ballast;
      a second stiffener hinge rotatably coupling the third and fourth stiffeners to one another;
      a third foot hinge rotatably coupling the third foot to the third stiffener; and
      a fourth foot hinge rotatably coupling the fourth foot to the fourth stiffener.

2. The assembly of claim 1, further comprising a vehicle configured to drive along the first and second ballasts, the vehicle comprising:
   first and second wheels contacting the first ballast;
   third and fourth wheels contacting the second ballast; and
   a body coupled to the first, second, third, and fourth wheels.

3. The assembly of claim 2, wherein the third and fourth wheels contact the second ballast within a gap between the second photovoltaic module and the third photovoltaic module.

4. The assembly of claim 2, wherein the body is configured to pass over the first and second photovoltaic modules as the vehicle drives along the first and second ballasts.

5. The assembly of claim 2, wherein the body is configured to pass under the first and second photovoltaic modules as the vehicle drives along the first and second ballasts.

6. The assembly of claim 2, wherein:
   the first and second ballasts each further comprises a third groove disposed between the first and second grooves;
   the first and second wheels contact the third groove of the first ballast; and
   the third and fourth wheels contact the fourth groove of the second ballast.

7. The assembly of claim 1, wherein at least one of the first stiffener hinge and the first and second foot hinges comprises a respective mechanical stop inhibiting rotation of that hinge beyond a respective predetermined angle; and
   wherein at least one of the second stiffener hinge and the third and fourth foot hinges comprises a respective mechanical stop inhibiting rotation of that hinge beyond a respective predetermined angle.

8. The assembly of claim 1, wherein the first stiffener is configured to be coupled along an edge of the first photovoltaic module, and wherein the second stiffener is configured to be coupled along an edge of the second photovoltaic module.

9. The assembly of claim 1, wherein:
   the first stiffener further is configured to be coupled to and support a fifth photovoltaic module; and
   the second stiffener further is configured to be coupled to and support a sixth photovoltaic module.

10. A method for supporting photovoltaic modules, comprising:
    providing first, second, and third elongated ballasts, each comprising first and second grooves and being arranged substantially parallel to one another;
    providing a first system, comprising:
       providing first and second elongated stiffeners respectively configured to be coupled to first and second photovoltaic modules so as respectively to support the first and second photovoltaic modules; and
       respectively coupling first and second feet to the first groove of the first ballast and the first groove of the second ballast;
       wherein the first and second stiffeners are rotatably coupled to one another with a first stiffener hinge;
       wherein the first foot and the first stiffener are rotatably coupled to one another with a first foot hinge; and
       wherein the second foot and the second stiffener are rotatably coupled to one another with a second foot hinge; and
    providing a second system, comprising:
       providing third and fourth elongated stiffeners respectively configured to be coupled to third and fourth photovoltaic modules so as respectively to support the third and fourth photovoltaic modules; and
       respectively coupling third and fourth feet to the second groove of the second ballast and the first groove of the third ballast;
       wherein the third and fourth stiffeners are rotatably coupled to one another with a second stiffener hinge;
       wherein the third foot and the third stiffener are rotatably coupled to one another with a third foot hinge; and
       wherein the fourth foot and the fourth stiffener stiffener are rotatably coupled to one another with a fourth foot hinge.

11. The method of claim 10, further comprising providing a vehicle configured to drive along the first and second ballasts, the vehicle comprising:
    first and second wheels contacting the first ballast;
    third and fourth wheels contacting the second ballast; and
    a body coupled to the first, second, third, and fourth wheels.

12. The method of claim 11, wherein the third and fourth wheels contact the second ballast within a gap between the second photovoltaic module and the third photovoltaic module.

13. The method of claim 11, wherein the body passes over the first and second photovoltaic modules as the vehicle drives along the first and second ballasts.

14. The method of claim 11, wherein the body passes under the first and second photovoltaic modules as the vehicle drives along the first and second ballasts.

15. The method of claim 11, wherein:
the first and second ballasts each further comprises a third groove disposed between the first and second grooves;
the first and second wheels contact the third groove of the first ballast; and
the third and fourth wheels contact the fourth groove of the second ballast.

16. The method of claim 10, wherein at least one of the first stiffener hinge and the first and second foot hinges comprises a respective mechanical stop inhibiting rotation of that hinge beyond a respective predetermined angle; and
wherein at least one of the second stiffener hinge and the third and fourth foot hinges comprises a respective mechanical stop inhibiting rotation of that hinge beyond a respective predetermined angle.

17. The method of claim 10, wherein the first stiffener is configured to be coupled along an edge of the first photovoltaic module, and wherein the second stiffener is configured to be coupled along an edge of the second photovoltaic module.

18. The method of claim 10, wherein:
the first stiffener further is configured to be coupled to a fifth photovoltaic module so as to support the fifth photovoltaic module; and
the second stiffener further is configured to be coupled to a sixth photovoltaic module so as to support the sixth photovoltaic module.

19. The method of claim 10, further comprising:
receiving a crate storing the first system in a shipping configuration, comprising:
the first and second feet folded parallel to the first and second photovoltaic modules by respective rotation of the first and second foot hinges; and
the first and second stiffeners folded parallel to one another by rotation of the first stiffener hinge;
the crate further storing the second system in a shipping configuration, comprising:
the third and fourth feet folded parallel to the third and fourth photovoltaic modules by respective rotation of the third and fourth foot hinges; and
the third and fourth stiffeners folded parallel to one another by rotation of the second stiffener hinge;
removing the folded first system from the shipped crate;
removing the folded second system from the shipped crate;
unfolding the first system into an installation configuration, comprising:
respectively unfolding the first and second feet by rotating the first and second foot hinges; and
unfolding the first and second stiffeners by rotating the first stiffener hinge;
unfolding the second system into an installation configuration, comprising:
respectively unfolding the third and fourth feet by rotating the third and fourth foot hinges; and
unfolding the third and fourth stiffeners by rotating the second stiffener hinge;
inserting the unfolded first foot into the first groove of the first ballast;
inserting the unfolded second foot into the first groove of the second ballast;
inserting the unfolded third foot into the second groove of the second ballast; and
inserting the unfolded fourth foot into the first groove of the third ballast.

20. The method of claim 19, further comprising:
adhering the first foot into the first groove of the first ballast;
adhering the second foot into the first groove of the second ballast;
adhering the third foot into the second groove of the second ballast; and
adhering the fourth foot into the first groove of the third ballast.

* * * * *